US011276694B2

(12) United States Patent
Rachmady et al.

(10) Patent No.: US 11,276,694 B2
(45) Date of Patent: Mar. 15, 2022

(54) TRANSISTOR STRUCTURE WITH INDIUM PHOSPHIDE CHANNEL

(71) Applicant: INTEL CORPORATION, Santa Clara, CA (US)

(72) Inventors: Willy Rachmady, Beaverton, OR (US); Matthew Metz, Portland, OR (US); Gilbert Dewey, Beaverton, OR (US); Nicholas Minutillo, Beaverton, OR (US); Cheng-Ying Huang, Hillsboro, OR (US); Jack Kavalieros, Portland, OR (US); Anand Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 661 days.

(21) Appl. No.: 16/139,684

(22) Filed: Sep. 24, 2018

(65) Prior Publication Data
US 2020/0098757 A1    Mar. 26, 2020

(51) Int. Cl.
| | |
|---|---|
| H01L 27/092 | (2006.01) |
| H01L 29/06 | (2006.01) |
| H01L 29/10 | (2006.01) |
| H01L 29/423 | (2006.01) |
| H01L 21/8238 | (2006.01) |
| H01L 29/08 | (2006.01) |
| H01L 29/78 | (2006.01) |
| H01L 29/66 | (2006.01) |
| H01L 29/207 | (2006.01) |

(52) U.S. Cl.
CPC .. *H01L 27/0924* (2013.01); *H01L 21/823821* (2013.01); *H01L 29/0673* (2013.01); *H01L 29/0847* (2013.01); *H01L 29/1033* (2013.01); *H01L 29/207* (2013.01); *H01L 29/42356* (2013.01); *H01L 29/66545* (2013.01); *H01L 29/7851* (2013.01)

(58) Field of Classification Search
CPC ............. H01L 27/0924; H01L 29/7851; H01L 29/66469; H01L 29/78681; H01L 29/0673
See application file for complete search history.

(56) References Cited

U.S. PATENT DOCUMENTS

2015/0357417 A1* 12/2015 Basu ................. H01L 21/02543
257/201
2016/0293601 A1* 10/2016 Maj .................. H01L 29/78669

\* cited by examiner

*Primary Examiner* — Changhyun Yi
(74) *Attorney, Agent, or Firm* — Schwabe, Williamson & Wyatt, P.C.

(57) ABSTRACT

An integrated circuit with at least one transistor is formed using a buffer structure on the substrate. The buffer structure includes one or more layers of buffer material and comprises indium, gallium, and phosphorous. A ratio of indium to gallium in the buffer structure increases from a lower value to a higher value such that the buffer structure has small changes in lattice constant to control relaxation and defects. A source and a drain are on top of the buffer structure and a body of Group III-V semiconductor material extends between and connects the source and the drain. A gate structure wrapped around the body, the gate structure including a gate electrode and a gate dielectric, wherein the gate dielectric is between the body and the gate electrode.

20 Claims, 7 Drawing Sheets

TRANSISTOR STRUCTURE WITH INDIUM PHOSPHIDE CHANNEL

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material that is generally referred to as a fin. The conductive channel of the FinFET device resides on the outer portions of the fin adjacent to the gate dielectric. Current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a gate-all-around (GAA) or nanoribbon transistor) is configured with one or more wires, ribbons, or sheets extending between the source and drain. The gate material generally surrounds or encircles each nanowire (hence, gate-all-around).

Figure 1:
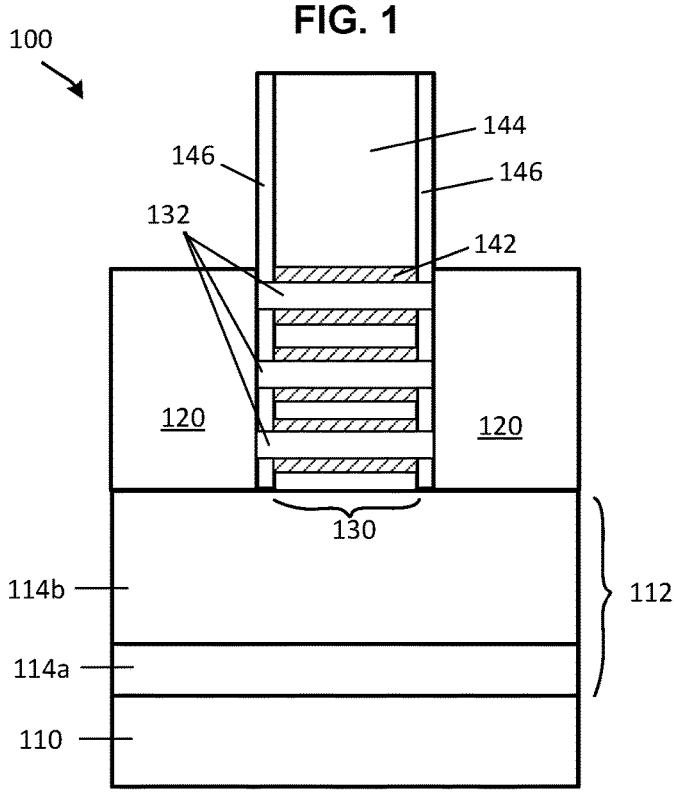
FIG. 1 is a cross-sectional view taken through the channel of a transistor structure with a nanowire channel region formed on a buffer and silicon substrate, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are disclosed for forming transistor structures using Group III-V semiconductor material, where the channel region has improved crystal quality over traditional methods. In one embodiment, a transistor structure has a silicon base or substrate and a channel of indium phosphide (InP) with improved crystal quality. For example, the InP has no defects as observed using transmission electron spectroscopy (TEM), such as fewer than 1E6 defects per square centimeter. To enable growth of high-quality materials used for the device, InP can be formed on a buffer structure that accommodates the large lattice mismatch between silicon and InP or other Group III-V materials. In accordance with some embodiments, a buffer structure includes a layer of gallium phosphide (GaP) on silicon. One or more layers of indium gallium phosphide (InGaP) are deposited on the GaP. In one such embodiment, a plurality of InGaP layers are deposited where each layer has an increased indium concentration. In such cases, each layer may also have a graded indium concentration. In another embodiment, the InGaP is deposited with a graded concentration of indium that increases from a first value at the layer of GaP (or silicon) to a higher value as the buffer structure thickness increases. Indium phosphide can be epitaxially grown on the buffer structure to provide a fin of InP with relatively little or no defects. Similarly, a superlattice of InP and indium gallium arsenide (InGaAs) can be grown on the buffer structure and processed to produce high quality nanowire or nanoribbon transistors with an InP channel.

Methodologies disclosed herein can be used to form Group III-V semiconductor structures using a buffer structure on a silicon substrate. In one specific embodiment, the buffer includes a layer of gallium phosphide (GaP) on silicon, followed by depositing indium gallium phosphide (InGaP) on the GaP, where the indium content in the InGaP increases in a graded or stepped manner. Such a buffer structure provides small changes in lattice constant (e.g., ~2%) to control relaxation and defects, thereby facilitating growth of high-quality Group III-V materials on the buffer structure. Accordingly, high-quality InP, InGaAs, or other Group III-V materials can be formed on a silicon substrate. The GaP layer is useful to overcome the transition from non-polar material (Si) to polar material (Group III-V) without large changes in lattice constant. The stepped buffer layer structure uses small changes in lattice constant to control defects and provide material layers that are fully relaxed, in accordance with some embodiments. Further, the buffer structure can be formed in some embodiments without or minimal amount of arsenic, enabling wafers to move freely through fabrication. Numerous variations and embodiments will be apparent in light of the present disclosure.

General Overview

To form the fin-shaped active channel of the FET, for example, indium phosphide can be grown in a trench formed in an insulating layer, such as silicon dioxide ($SiO_2$) or silicon nitride (SiN). The trench, sometimes referred to as an aspect ratio trapping trench or "ART" trench, extends through the insulating layer at least to, and sometimes into, the semiconductor substrate. In devices having an indium phosphide channel on silicon, a thin layer of gallium arsenide or other III-V material can be used as the interface between the silicon base and the indium phosphide channel layer. For example, a layer of gallium arsenide (GaAs) is grown on silicon using an ART trench. After recessing the GaAs material in the trench to the desired height, indium phosphide (InP) can be grown in the trench on top of the GaAs. The insulating layer of $SiO_2$ is then removed to expose a fin of indium phosphide that can be processed to include a gate on the InP fin (e.g., a trigate structure). Although such approach can be used to produce FinFET architectures, an ART trench does not allow for a superlattice structure needed to form gate-all-around (GAA) nanowire/nanoribbon transistors.

Thus, and in accordance with various embodiments of the present disclosure, techniques are provided for epitaxial growth of high-quality InP and other Group III-V materials on a silicon substrate. A multilayer buffer structure on a silicon substrate accommodates the large lattice mismatch between silicon and indium phosphide and can be used as a template to grow high quality InP with virtually no defects. Each layer of the buffer structure has a small lattice mismatch with the layer on which it is grown, such as not greater than 2.5% or not greater than 2.0%. Such a buffer structure results in relaxed buffer materials that can be used as a template for epitaxial growth of other Group III-V semiconductor materials.

In one specific embodiment, a multilayer buffer structure on a silicon substrate is used for fabricating a nanowire transistor with an indium phosphide channel, where the indium phosphide nanowires are virtually free of defects as analyzed using transmission electron microscopy (TEM). For example, the InP fewer than 1E6 stacking faults per square centimeter, the limit of detection for some TEM instruments. In some embodiments, the channel material has a defect/stacking fault density of at most 1E9, 5E8, 1E8, 5E7, 1E7, 5E6, 1E6, 5E5, 1E5, 5E4, or 1E4 per square cm, for example. Note that some stacking faults may exist in the channel material when prepared in accordance with some embodiments of the present disclosure, but such defects are not visible due to the resolution limits of TEM showing only features greater than about 0.2 nm in size.

In accordance with some embodiments of the present disclosure, a multilayer buffer structure includes a first layer of buffer material on the substrate and one or more additional layer of buffer material that is compositionally distinct from the first layer. The first layer of buffer material has a lattice mismatch of two percent or less with the substrate, for example. Subsequent layers also have a lattice mismatch of two percent or less with the layer below it. For example, a buffer layer of InGaP can have a graded concentration of indium or can be a plurality of layers of InGaP with increasing indium content in each successive layer. In one such embodiment, the second layer of buffer material (e.g., InGaP) has a graded concentration of indium that increases from about 11-16 atomic percent (In:Ga from 0.25 to 0.4) to about 50-68 atomic percent (In:Ga from 2-4). In another example, the In:Ga ratio increases from 1:3 to 3:1 using three or more layers of InGaP. Numerous variations and embodiments will be apparent in light of the present disclosure.

In another embodiment, a layer of high-quality indium phosphide is grown on the buffer structure and then processed to form a fin-based transistor with an InP channel region. In another embodiment, a layer stack or superlattice of indium gallium arsenide (InGaAs) and indium phosphide (InP) is grown on the buffer structure, followed by processing the layer stack in to fins and then into nanowires or nanoribbons. In some embodiments, the lattice mismatch from layer to layer is about 2.5 percent or less. For example, the lattice mismatch is 2.5% or less between each layer of buffer material and the material below it, and between the InP or InGaAs and the top layer of buffer material. In other embodiments, the lattice mismatch between two layers of material is 2% or less, 1.5% or less, or 1.0% or less. Structures formed according to methodologies of the present disclosure can provide InP and other Group III-V channel materials that are virtually free of defects, resulting in improved carrier mobility over channel material formed according to traditional methods.

As used herein, the term "nanowire" is not limited to structures of a particular cross-sectional shape, but includes structures of a rectangular, square, trapezoidal, "racetrack" (e.g., parallel sides connected by rounded ends), circular, oval, elongated, and other cross-sectional shapes, some of which may be referred to as nanoribbons or beaded-fins. Specifically, in accordance with some embodiments, a nanowire is a structure that has a thickness or diameter on the order of tens of nanometers or less, and an unconstrained length.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon.

As discussed herein, terms referencing direction, such as upward, downward, vertical, horizontal, left, right, front, back, etc., are used for convenience to describe embodiments of integrated circuits having a substrate extending in a horizontal plane. Embodiments of the present disclosure are not limited by these directional references and it is contemplated that integrated circuits and device structures in accordance with the present disclosure could be used in any orientation.

In some embodiments, the techniques described herein can be used to benefit n-channel devices (e.g., NMOS) and/or p-channel devices (e.g., PMOS). Further, in some embodiments, the techniques described herein can be used to benefit MOSFET devices, finFET devices, power transistors, high-frequency devices, and/or any other suitable devices as will be apparent in light of this disclosure. Further still, in some embodiments, the techniques described herein can be used to form complementary transistor circuits (such as CMOS circuits), where the techniques can be used to benefit one or more of the included n-channel and p-channel transistors making up the CMOS circuit. Further yet, in some embodiments, the techniques described herein can be used to benefit a multitude of transistor configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof (e.g., beaded-fin configurations), to provide a few examples. In addition, in some embodiments, the techniques can be used for a variety of source/drain (S/D) configurations, such as replacement material S/D, cladded S/D, and/or any other suitable S/D configuration as will be apparent in light of this disclosure. The techniques described herein may be used to benefit logic transistor devices or transistor-based devices used for other suitable applications (e.g., amplification, switching, etc.). Therefore, the techniques described herein can be used to benefit a multitude of transistor devices. In general, the techniques allow transistors to be further scaled with diverse channel materials, while ensuring higher operating voltage, higher drive currents, and thereby improved performance.

As used herein, the expression "X includes at least one of A or B" refers to an X that may include, for example, A without B, B without A, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include A without B or C, B without A or C, C without A or B, A and B (and not C), A and C (and not B), B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in A only, in B only, or in both A and B. The above discussion with respect to "X includes at least one of A or B" equally applies here, as will be appreciated.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate a transistor including a silicon substrate and an indium phosphide channel material. For example, TEM can be useful to show a cross section of the device structure to reveal the presence of detectable defects. In another example, x-ray crystallography can be useful to illustrate the crystal quality and composition of the active channel material. In some embodiments, the techniques described herein may be detected based on the benefits derived from their use, which includes channel materials with improved crystal structure, improved carrier mobility, relatively higher operating voltage, relatively higher drive currents, and/or other improved device performance. Numerous configurations and variations will be apparent in light of this disclosure.

Architecture and Methodology

Figure 2:
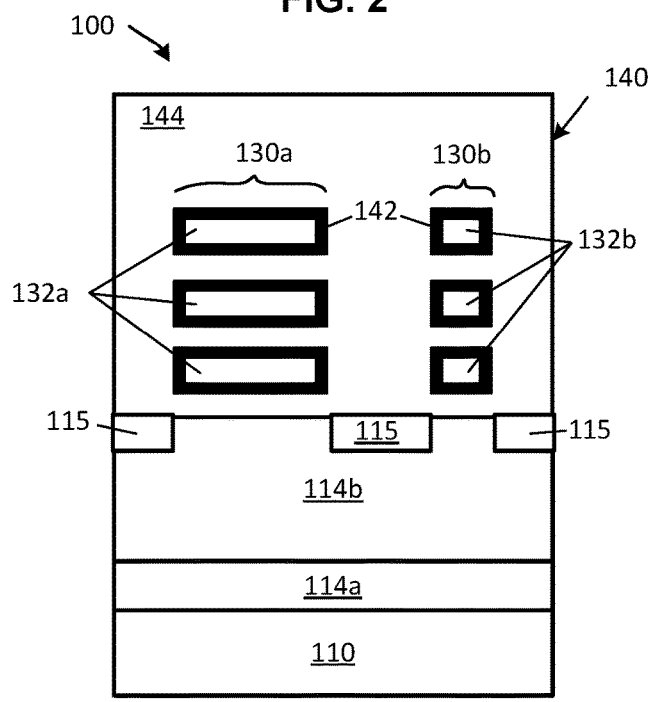
FIG. 2 is a cross-sectional view taken through the gate of adjacent nanoribbon and nanowire devices, and shows a buffer structure on the substrate and cross-sections of the channel regions, in accordance with an embodiment of the present disclosure.

FIGS. 1 and 2 illustrate cross-sectional views of a transistor structure 100 in accordance with an embodiment of the present disclosure. FIG. 1 is a section taken through the channel region 130 and S/D 120 of the transistor structure 100, such as along line A-A shown in FIG. 11. FIG. 2 is a section taken through the gate structure 140, perpendicular to the channel regions 130 of two devices, such as along line B-B shown in FIG. 11. In these example embodiments, the transistor structure 100 has a nanowire or nanoribbon configuration. The transistor structure 100 is formed on a base layer or substrate 110, such as single-crystal silicon or other suitable semiconductor material. A buffer 112 with one or more layers of buffer material 114 is on the substrate 110. For example, the buffer 112 includes a first layer 114a of buffer material on the substrate 110 and an additional layer 114b of buffer material on the first layer 114a. In one embodiment, the first layer 114a of buffer material is gallium phosphide (GaP) and the second layer 114b of buffer material is indium gallium phosphide (InGaP). Such materials can include dopants and other trace impurities, as will be appreciated. In one such embodiment, the InGaP has a graded concentration of indium that increases with vertical thickness of the layer from a ratio of indium to gallium of about 1:3 to a ratio of about 3:1.

The transistor structure 100 has a source and drain 120 on the buffer 112 with nanowires 132 of InP (or other Group III-V material) extending between and connecting the source and drain 120. In some embodiments, an intervening material (not shown) may be between the source/drain and the buffer 112, such as a layer of isolation material or residual material from replacement gate processing. In such embodiments, the source/drain 120 are considered to be on top of the buffer 112 even if not in direct contact with the buffer 112.

A gate structure 140 is formed over and in contact with the channel region 130 between the source and drain 120. The gate structure 140 includes a gate dielectric 142, a gate electrode 144, and gate spacers 146, for example. The gate spacers 146 contact opposite faces of the gate electrode 144 and electrically isolate the source and drain 120 from the gate electrode 144. The gate dielectric 142 and gate electrode 144 wrap around the body of each nanowire 132 between the gate spacers 146. The gate spacers 146 contact and wrap around ends of each nanowire 132. In this example, the channel region 130 is illustrated as having three nanowires 132 extending between and connecting the source and drain 120. In other embodiments, the channel region 130 can be a fin, one or more nanoribbons, or one or more nanosheets, for example. Also, more or fewer nanowires/nanoribbons/nanosheets 132 can be used, as will be appreciated.

FIG. 2 shows a section taken through the gate structure 140 and perpendicular to the channel regions 130 of two devices. The gate structure 140 includes a gate dielectric 142 and a gate electrode 144, where the gate dielectric 142 is between the channel region 130 (e.g., nanowire) and the gate electrode 144. The channel region 130a of one of the devices (shown at left) includes nanoribbons 132a and the channel region 130b of the other device (shown at right) includes nanowires 132b. The gate structure 140 wrapped around each nanoribbon 132a and each nanowire 132b. In this example embodiment, channel region 130a is characterized as having a nanoribbon structure due to having a wide and flat cross-sectional shape of the nanoribbons 132a rather than a more square or round shape as for nanowires 132b. The geometries illustrated in FIG. 2 are merely examples, however, and may not represent the actual geometry of such structures. Regions of shallow trench isolation (STI) material 115 extend into the second layer 114b of buffer material.

Figure 3:
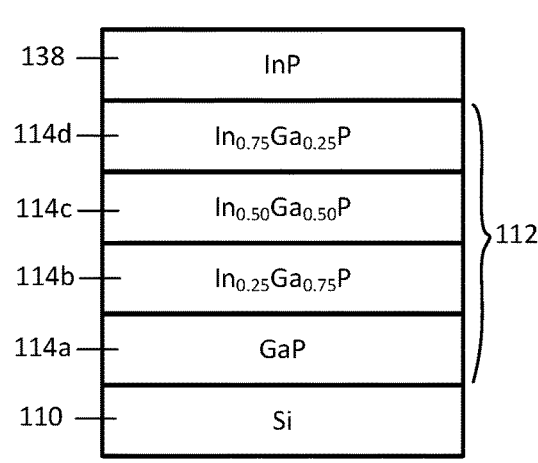
FIG. 3 illustrates a cross section of a multilayer buffer structure on a silicon substrate, in accordance with an embodiment of the present disclosure.

In other embodiments, such as shown in FIG. 3, the buffer 112 includes a plurality of layers of buffer material. For example, the buffer 112 includes a first layer 114a of buffer material of GaP. This layer is optional in some embodiments. Compared to silicon, the GaP has a lattice mismatch of about 0.36%, therefore providing a low concentration of defects in the GaP material. The GaP also is useful to overcome the transition from non-polar (Si) to polar (Group III-V) without a large difference in lattice constant. Additional layers 114b, 114c, 114d of buffer material are deposited on the first layer 114a of buffer material. For example, the additional layers of buffer material include a first additional layer 114b of $In_{0.25}Ga_{0.75}P$, a second additional layer 114c of $In_{0.50}Ga_{0.50}P$, and a third additional layer 114d of $In_{0.75}Ga_{0.25}P$. In this example, each layer of buffer material has a lattice constant that differs by no more than about 2% compared to the layer on which it is deposited. In some embodiment, the layer of GaP is omitted since $In_{0.25}Ga_{0.75}P$ has a lattice mismatch with silicon of about 2% with silicon.

In another example, the In:Ga ratio of the first InGaP layer is 1:10, 1:8, 1:6, 1:4 or some other value below 1:3 and the last (top) layer of InGaP has an In:Ga ratio of 3, 3.5, 4, 4.5, 5, or 5.5. In one specific example, the first buffer material on the silicon substrate is gallium phosphide (GaP). Additional layers of buffer material are indium gallium phosphide (InGaP). In other embodiments, the layer of GaP is optional. More or fewer buffer layers can be used, depending on the acceptable limit of defects and the difference in lattice constant mismatch of the various materials, as will be appreciated. To avoid bowing the substrate, the buffer 112 has a thickness in some embodiments not greater than 1 µm, including 750 nm or less, 500 nm or less, 400 nm or less, 300 nm or less, and 200 nm or less. Other thickness values may be used based on the acceptable tolerances of the device to be produced.

On top of the buffer 112, a layer stack 134 of materials (e.g., a superlattice) can be formed of Group III-V materials that have low concentrations of defects, such as stacking faults and misfit dislocations. In one embodiment, the layer stack includes alternating layers of indium gallium arsenide (InGaAs) and indium phosphide (InP). This layer stack can be processed to define a fin, then further processed to define a GAA transistor with a channel region of nanowires or nanoribbons as discussed in more detail below. In some embodiments, the channel has a defect/stacking fault density of at most 1E9, 5E8, 1E8, 5E7, 1E7, 5E6, 1E6, 5E5, 1E5, 5E4, or 1E4 per $cm^2$. As used herein, "defect free" or "virtually defect free" means having fewer than 1E6 defects per $cm^2$, which commonly corresponds to the limit of detection for some TEM technology.

A multitude of different transistor devices can benefit from the techniques described herein, including, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques may be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter, for example), in accordance with some embodiments. In another example, the techniques may be used to benefit a p-channel MOSFET (PMOS) device, which may include a source-channel-drain scheme of p-n-p or p-i-p, in accordance with some embodiments. In yet another example, the techniques may be used to benefit a TFET device, which may include a source-channel-drain scheme of p-i-n or n-i-p, in accordance with some embodiments. In still another example, the techniques may be used to benefit a FFFET device, which may include a source-channel-drain scheme of np-i-p (or np-n-p) or pn-i-n (or pn-p-n), in accordance with some embodiments.

In addition, in some embodiments, the techniques may be used to benefit transistors including a multitude of configurations, such as planar and/or non-planar configurations, where the non-planar configurations may include finned or FinFET configurations (e.g., dual-gate or tri-gate), gate-all-around (GAA) configurations (e.g., nanowire, nanoribbon, nanosheet), or some combination thereof (e.g., a beaded-fin configurations), to provide a few examples. Further, techniques of the present disclosure may be used to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Figure 4:
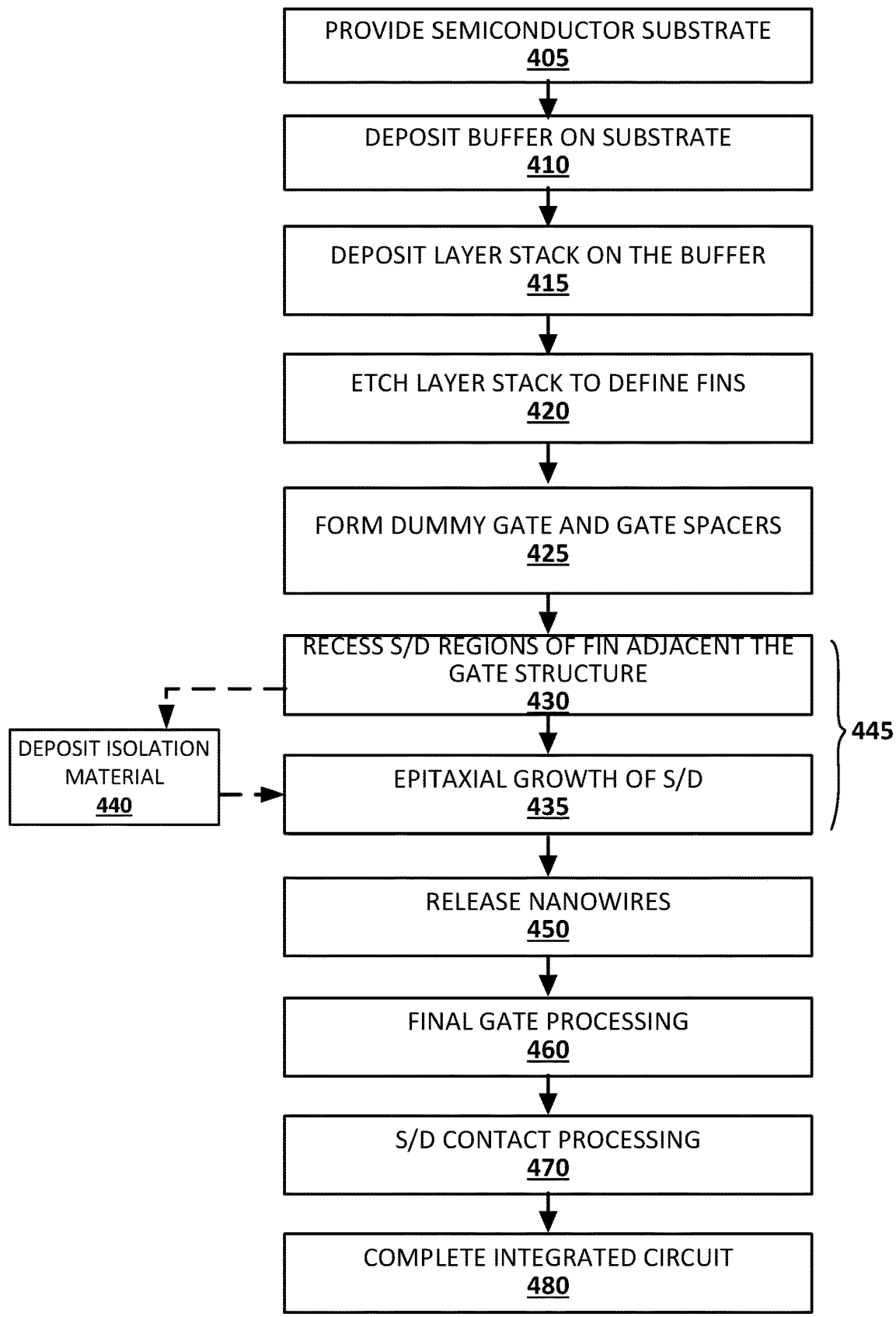
FIG. 4 illustrates a process flow for a method of forming a nanowire transistor, in accordance with an embodiment of the present disclosure.

Turning now to FIG. 4, a flowchart illustrates a process flow for a method 400 of forming an integrated circuit that includes one or more nanowire or nanoribbon transistor, in accordance with an embodiment of the present disclosure. Processes in method 400 include blanket deposition techniques and/or any other suitable techniques as will be apparent in light of this disclosure. Although processes in this example are described in the context of forming a nanowire FET transistor, other nanowire or nanoribbon structures can be formed using a variation of method 400, including planar transistor configurations, vertical transistor structures, FinFETs, TFETs, and the like.

In one embodiment, method 400 begins with providing 405 a semiconductor substrate 110. The substrate 110 may include any suitable material, such as monocrystalline semiconductor material that includes at least one of silicon (Si), germanium (Ge), carbon (C), tin (Sn), phosphorous (P), boron (B), arsenic (As), antimony (Sb), indium (In), and gallium (Ga) to name a few examples. In some embodiments, the substrate 110 is bulk silicon, such as monocrystalline silicon wafer. In other embodiments, the substrate 110 can be any suitable semiconductor material, including silicon, silicon carbide (SiC), gallium nitride (GaN), and gallium arsenide (GaAs) to name a few examples. The substrate 110 can be selected in some embodiments from III-V materials and group IV materials. Further, the substrate 110 can comprise a semiconductor material layer deposited or grown on a substrate.

The substrate 110 in some embodiments may include a Si on insulator (SOI) structure where an insulator/dielectric material (e.g., an oxide material, such as silicon dioxide) is sandwiched between two Si layers (e.g., in a buried oxide (BOX) structure), or any other suitable substrate where the top layer includes monocrystalline Si. In some embodiments, the substrate 110 may be doped with any suitable n-type and/or p-type dopant at a dopant concentration in the range of 1E16 to 1E22 atoms per cubic cm, for example. For instance, a silicon substrate can be p-type doped using a suitable acceptor (e.g., boron) or n-type doped using a suitable donor (e.g., phosphorous, arsenic) with a doping concentration of at least 1E16 atoms per cubic cm. However, in some embodiments, the substrate 110 may be undoped/intrinsic or relatively minimally doped (such as including a dopant concentration of less than 1E16 atoms per cubic cm), for example. In some embodiments, the substrate 110 is a substrate consisting essentially of Si, such as a monocrystalline silicon wafer. In other embodiments, the substrate 110 may primarily include Si but may also include other material (e.g., a dopant at a given concentration). Also, note that the substrate 110 may include relatively high quality or device-quality monocrystalline Si or other material that provides a suitable template or seeding surface from which other monocrystalline semiconductor material features and layers can be formed. Therefore, unless otherwise explicitly stated, a substrate 110 as described herein is not intended to be limited to a substrate that only includes Si.

In some embodiments, the substrate 110 may have a crystalline orientation described by a Miller index of (100), (110), or (111), or its equivalents, as will be apparent in light of this disclosure. Although the substrate 110 in this example embodiment is shown for ease of illustration as having a thickness (dimension in the Z-axis direction) similar to that of other layers in the figures, the substrate 110 may be relatively much thicker than the other layers, such as having a thickness in the range of 1 to 950 microns (or in the sub-range of 20 to 800 microns), for example, or any other suitable thickness or range of thicknesses as will be apparent in light of this disclosure. In some embodiments, the substrate 110 may include a multilayer structure including two or more distinct layers that may or may not be compositionally different. In some embodiments, the substrate 110 may include grading (e.g., increasing and/or decreasing) of one or more material concentrations throughout at least a portion of the material. In some embodiments, the substrate 110 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Method 400 continues with depositing 410 a buffer 112 on the substrate 110. In some embodiments, the buffer 112 includes a first layer 114a of buffer material, such as gallium phosphide (GaP). Gallium phosphide has a lattice mismatch of only 0.36% with silico. Gallium phosphide is also useful to overcome the transition from non-polar (Si) to polar (Group III-V) without a large difference in lattice constant. In one embodiment, the layer of GaP is omitted and process 410 proceeds with growth of $In_xGa_{1-x}P$ directly on the silicon substrate, where x is 0.25 or less (described below as additional layers 114b).

The buffer 112 includes one or more additional layers 114b of buffer material grown on the first layer 114a, in accordance with some embodiments. For example, the buffer 112 has from 1 to n additional layers 114b of buffer material, where the first of the additional layers has a lattice mismatch of about two percent or less with respect to the substrate, and where the nth additional layer 114 of buffer material has a lattice mismatch of about two percent or less with the channel material to be grown. In one embodiment, an additional layer 114b of buffer material is InGaP with a graded concentration of indium. For example, the additional layer 114b begins on the first layer 114a as $In_{0.25}Ga_{0.75}P$ and gradually increases in indium concentration with thickness to $In_{0.75}Ga_{0.25}P$. In other embodiments, the indium concentration may start at a lower level (e.g., 0 to 10 atomic percent) and/or may increase to a higher level (e.g., to 75 atomic percent). Since $In_{0.25}Ga_{0.75}P$ has a lattice mismatch of about 2% with silicon, the resulting material can be grown with a low concentration of defects. Similarly, since InP and $In_{0.75}Ga_{0.25}P$ differ in lattice constant by about 2%, InP can be grown on the buffer 112 with a low concentration of defects.

In other embodiments, the additional layers 114b of buffer material include a first additional layer 114b of $In_{0.25}Ga_{0.75}P$, a second additional layer 114c of $In_{0.50}Ga_{0.50}P$, and a third additional layer 114d of $In_{0.75}Ga_{0.25}P$. In this example, each layer of buffer material has a lattice constant that differs by no more than about 2% compared to the layer on which it is deposited. More or fewer buffer layers can be used, depending on the acceptable limit of defects and lattice constants of the various materials, as will be appreciated. In some embodiments, the buffer material 112 has a thickness not greater than 500 nm, including 400 nm or less, 300 nm or less, and 200 nm or less.

In some embodiments, one or more layers of the buffer material may be doped with a suitable dopant (e.g., boron, phosphorous, and/or arsenic). In embodiments where the buffer material is doped, it may be n-type doped (e.g., with phosphorous or arsenic) or p-type doped (e.g., with boron) at a dopant concentration in the range of 1E16 to 1E22 atoms per cubic cm, for example.

Figure 5:
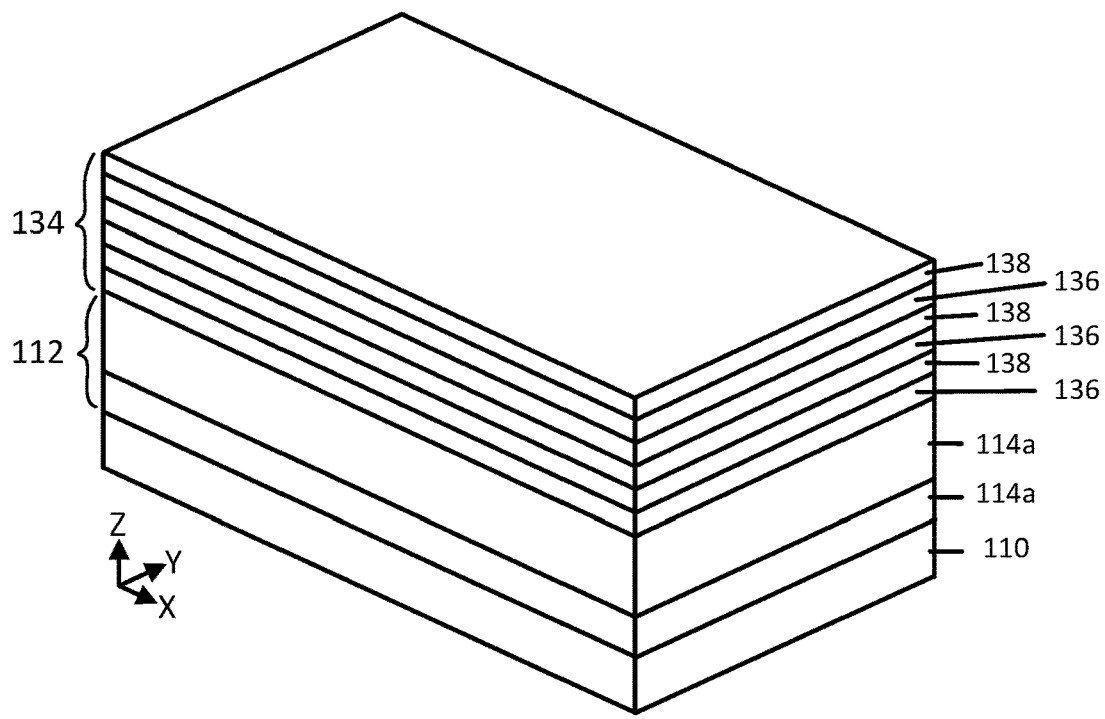
FIG. 5 illustrates a perspective view of a superlattice formed on a buffer and silicon substrate, in accordance with an embodiment of the present disclosure.

Method 400 continues with depositing 415 a layer stack 134 on the buffer 112, where the layer stack 134 has alternating layers of a sacrificial material 136 and channel material 138, in accordance with some embodiments. FIG. 5 illustrates a perspective view of an example structure with a silicon substrate 110, a buffer 112 that includes a first layer 114a of buffer material (e.g., GaP), and a second layer 114b of buffer material (e.g., InGaP), and a layer stack 134 of sacrificial material 136 and channel material 138.

In one embodiment, alternating blanket layers of sacrificial material 136 and channel material 138 can be formed using layer-by-layer epitaxial growth, where the sacrificial material 136 can subsequently be removed to release nanowires of the channel material 138. In one embodiment, a first layer of sacrificial material 136 is formed directly on the buffer 112, followed by forming a first layer of channel material 138 directly on the first layer of sacrificial material 136, and followed similar fashion by depositing additional layer pairs of sacrificial material 136 and channel material 138. For example, the first (bottom) layer is the sacrificial material 136 and the last (top) layer of the layer stack 134 is the channel material 138 (e.g., InP). In some embodiments, a final layer of sacrificial material 136 is deposited on top of the top layer of channel material 138 so that all layers of channel material 138 are sandwiched between layers of the sacrificial material 136. In one example embodiment, the sacrificial material 136 is monocrystalline indium gallium arsenide (InGaAs) and the channel material 138 is monocrystalline indium phosphide (InP). Other pairs of sacrificial material 136 and channel material 138 can be used, as will be appreciated. Optionally, the channel material 138 can be doped during epitaxy with a suitable dopant at a desired concentration, as will be appreciated.

Layer stack 134 can be formed using any suitable techniques, such as one or more deposition or epitaxial growth processes (e.g., CVD, PVD, ALD, VPE, MBE, LPE), melt regrowth, and/or any other suitable processing, as will be appreciated in light of the present disclosure. In some embodiments, the sacrificial material 136 and the channel material 138 are deposited as blanket layers on the buffer 112. Due to a lattice mismatch of about 2% or less (or no greater than 2.5%), high quality channel material 138 and sacrificial material can be grown. Additional processing can be performed after depositing each layer, if so desired, such as cleaning and polishing one material prior to deposition of the next material. In some embodiments, a given material of the layer stack 134 has a vertical thickness (dimension in the Z-axis direction) in the range of 5 nm to 50 nm (or in a subrange of 5-45, 5-40, 5-35. 5-30. 5-25, 5-20, 5-15, 5-10, 10-40, 10-30, 10-20, 15-40, 15-30, 15-20, 20-40, 20-30 and 30-40 nm) and/or a maximum vertical thickness of at most 50, 40, 30, 25, 20, 15, or 10 nm, for example. Other vertical thickness requirements or thresholds can be used, as will be apparent in light of this disclosure. The vertical thickness of each layer can be selected to provide the desired geometry of the nanowire, nanoribbon, or nanosheet to be subsequently formed. The materials in the layer stack 134 need not have the same vertical thickness from layer to layer nor among layers of a given material. Thus, for example, subsequently formed nanowires can have vertical spacing and vertical nanowire dimensions that may be the same or different for each nanowire, as will be appreciated.

In some embodiments, multiple different channel materials 138 may be deposited on different areas of the substrate, such as for CMOS applications, for example. For instance, a first channel material 138 may be formed on a first area of the substrate to be used for one or more PMOS devices and a second channel material 138 may be formed on a second area of the substrate to be used for one or more NMOS devices. By selecting the buffer 112 to have the desired properties (e.g., lattice constant), multiple different channel materials 138 can be formed. For instance, in some such embodiments, the first channel material may include a n-type group III-V or group IV material and a second channel material may include a p-type group III-V or group IV material.

In some embodiments employing multiple different channel materials, the first channel material 138 may include group IV semiconductor material (e.g., Si, SiGe, Ge, etc.) and the second channel material 138 may include group III-V semiconductor material (e.g., GaAs, InGaAs, InP, etc.). In general, a given channel material may include monocrystalline group IV semiconductor material and/or group III-V semiconductor material. For instance, in a beaded-fin transistor configuration, the channel region may include both group IV semiconductor material (e.g., for the broader or narrower portions) and group III-V semiconductor material (e.g., for the other of the broader or narrower portions). Note that the multiple different channel materials may be formed using any suitable techniques, such as masking, depositing, and removing the masking as desired to form any number of compositionally different channel materials. Numerous different channel material configurations and variations will be apparent in light of this disclosure.

Method 400 continues with defining 420 fins 160 from the layer stack 134, in accordance with one embodiment. For example, each fin 160 has a subfin portion 162 comprising an additional layer 114b of buffer material (e.g., $In_{0.75}Ga_{0.25}P$), and an upper fin portion of the layer stack 134 of alternating layers of sacrificial material 136 and channel material 138. In embodiments where blanket layers of material are formed on the buffer 112 in process 415, for example, regions to be processed 420 into fins are masked, followed by etching the surrounding regions to define one or more fins 160. For instance, the anisotropic etch proceeds substantially vertically through the layer stack 134 to define isolation trenches between adjacent fins 160. In some embodiments, the etch process proceeds into the substrate 110 to define a fin that includes a subfin portion comprising the buffer 112 and material of the substrate 110.

Figure 6:
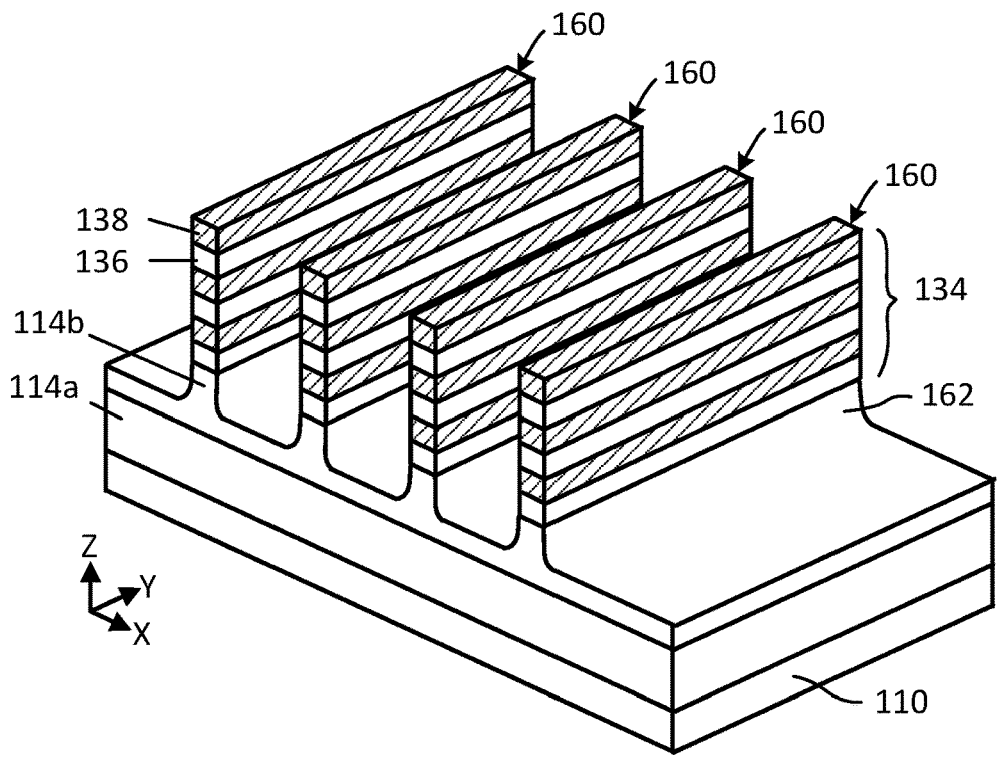
FIG. 6 illustrates a perspective view of the structure of FIG. 5 after processing the superlattice into fins, in accordance with an embodiment of the present disclosure.

In some embodiments, the etch process defines groups of parallel fins 160 extending vertically up from the substrate 110. FIG. 6 illustrates a perspective view of one example structure showing fins 160 extending up from the substrate 110. Each fin 160 includes a subfin portion 162 that includes a portion of the buffer 112. Each fin 160 has alternating layers of sacrificial material 136 and channel material 138 from the layer stack 134. In other embodiments, the etch defines planar or 3D transistor structures having an H shape, where the channel region 130 corresponds to the horizontal beam of the H extending between the source and drain regions 120 represented by a rectangular shape connected by the channel region 130 extending therebetween.

In some embodiments, each fin 160 may include a vertical fin height (dimension in the Z-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/ or a maximum vertical fin height of at most 500, 450, 400, 350, 300, 250, 200, 150, 100, or 50 nm, for example. In some embodiments, each fin may include a horizontal fin width (dimension in the X-axis direction) in the range of 2-50 nm (or in a subrange of 2-5, 2-10, 5-10, 5-20, 5-30, 5-50, 10-20, 10-30, 10-50, 20-30, 20-50, or 30-50 nm) and/or a maximum horizontal fin width of at most 50, 30, 20, 10, or 5 nm, for example. In some embodiments, the ratio of fin height to fin width may be greater than 1, such as greater than 1.5, 2, 2.5, 3, 3.5, 4, 4.5, 5, 6, 7, 8, 9, 10, 15, 20, or greater than any other suitable threshold ratio, as will be apparent in light of this disclosure. Other suitable materials and thickness values/ranges/thresholds will be apparent in light of this disclosure.

In some embodiments, the substrate 110 or buffer material may be oppositely type doped relative to the overlying channel material 138 to provide a tunnel diode configuration to help reduce or eliminate parasitic leakage (e.g., subthreshold leakage). For instance, in some embodiments, the top (additional) layer 114b of buffer material may be intentionally p-type doped (e.g., with a doping concentration of at least 1E16, 5E16, 1E17, 5E17, 1E18, 5E18, or 1E19 atoms per cubic cm) if the overlying material is to be n-type doped, or vice versa.

Method 400 continues with defining 425 a gate structure 140 in contact with the top and sides of each fin 160. In one embodiment, process 425 includes filling trenches between the fins 160 with shallow trench isolation (STI) material 152. Such processing can include depositing the STI material 152 and then optionally planarizing/polishing the structure (e.g., via CMP). In some embodiments, deposition of the STI material 152 may include any suitable deposition techniques, such as those described herein (e.g., CVD, ALD, PVD), or any other suitable deposition process. In some embodiments, STI material 152 may include any suitable electrical insulator material, such as one or more dielectric, oxide (e.g., silicon dioxide), and/or nitride (e.g., silicon nitride) materials. In some embodiments, the STI material 152 may be selected based on the material of the substrate 110. For example, the STI material 152 may be selected from silicon dioxide or silicon nitride based on the use of a Si substrate 110. The STI material 152 is recessed to expose the layer stack 134 portion of the fins 160.

In accordance with some embodiments, the gate structure 140 is a dummy gate structure formed on the channel region 130 of the fins 160. In one embodiment, the gate structure 140 includes a dummy gate electrode 142 and, optionally, a hardmask 148. In this example, defining 425 the gate structure 140 is performed in accordance with a gate-last process flow. In some embodiments, the dummy gate electrode 142 is made of polysilicon or other suitable material, as will be appreciated. A gate-last fabrication process may utilize a dummy gate structure 140 to allow for replacement gate processing, while a gate-first fabrication process may form the final gate structure in the first instance; the final gate structure can be formed after the S/D regions 120 have been processed. In other embodiments, the techniques may be performed using a gate-first process flow. In either a gate-last or a gate-first process flow, the end structure will include the final gate stack, as will be apparent in light of this disclosure. The dummy gate structure can define the channel region 130 and source/drain (S/D) regions 120 of each fin 160, where the channel region 130 is under the gate structure 140 (whether dummy or final gate stack), and the source and drain regions 120 are on either side of the gate structure 140 and connect to the channel region 130.

Process 425 includes forming gate spacers 146 on opposite sides of the dummy gate electrode 144. The gate spacers 146 may include any suitable material, such as any suitable electrical insulator, dielectric, oxide (e.g., silicon oxide), and/or nitride (e.g., silicon nitride) material, as will be apparent in light of this disclosure. In one embodiment, the gate spacers 146 are formed of silicon nitride ($Si_3N_4$). Note that in some embodiments, a hardmask 148 may be formed over the dummy gate structure 140 to protect the dummy gate electrode 144 and gate spacers 146 during subsequent processing, for example. In some embodiments, the hardmask 148 is formed on top of the dummy gate electrode between the gate spacers 146.

Figure 7:
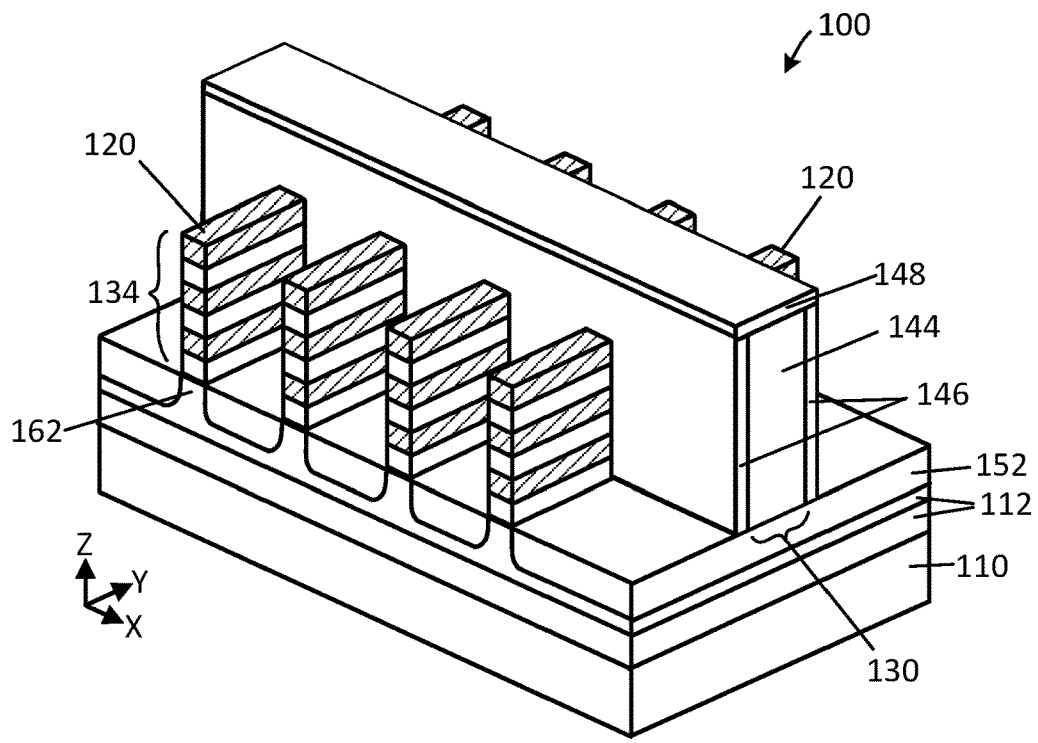
FIG. 7 illustrates a perspective view the structure of FIG. 6 after forming a dummy gate structure on the fins, in accordance with an embodiment of the present disclosure.

FIG. 7 illustrates a perspective view of an example structure with fins 160 extending up from substrate 110 and STI material 152 between the subfin portion 162 of the fins 160. The dummy gate structure 140 is formed in contact with the top and sides of each fin 160, defining the channel region 130 below it. The gate structure 140 includes a dummy gate electrode 144, gate spacers 146 on opposite lateral sides of the gate electrode 144, and a hardmask 148.

Method 400 continues with processing 445 the source/ drain 120 using any suitable techniques, in accordance with an embodiment of the present disclosure. For example, processing 445 the source and drain 120 can be performed by recessing 430 at least a portion of the exposed source and drain portion 120 of the fins 160. In some embodiments, all of the layer stack 134 is removed in the source and drain regions 120 of the fin 160, in addition to some amount of the buffer material 112 below the layer stack 134. In other embodiments, the etch process stops short of completely removing the layer stack 134 at the source and drain regions 120, leaving behind a stub or residual portion of the fins 160. For example, the stub is a portion of the first (bottom) layer of sacrificial material 136 formed on the top layer of buffer material 114 (e.g., $In_{0.75}Ga_{0.25}P$). The source/drain etch exposes ends of the nanowire/nanoribbon channel material 138 at the outside surface of the gate spacers 146. The resulting structure may be masked as needed for deposition or growth of replacement source/drain material, as discussed in more detail below. In some embodiments, the exposed layer stack 134 in the source/drain regions of the fins need not be completely removed; instead, the material in the layer stack 134 at the source/drain regions 120 is converted to final source/drain regions by doping, implantation, and/or cladding with a source/drain material or other suitable processing, for example.

Figure 10:
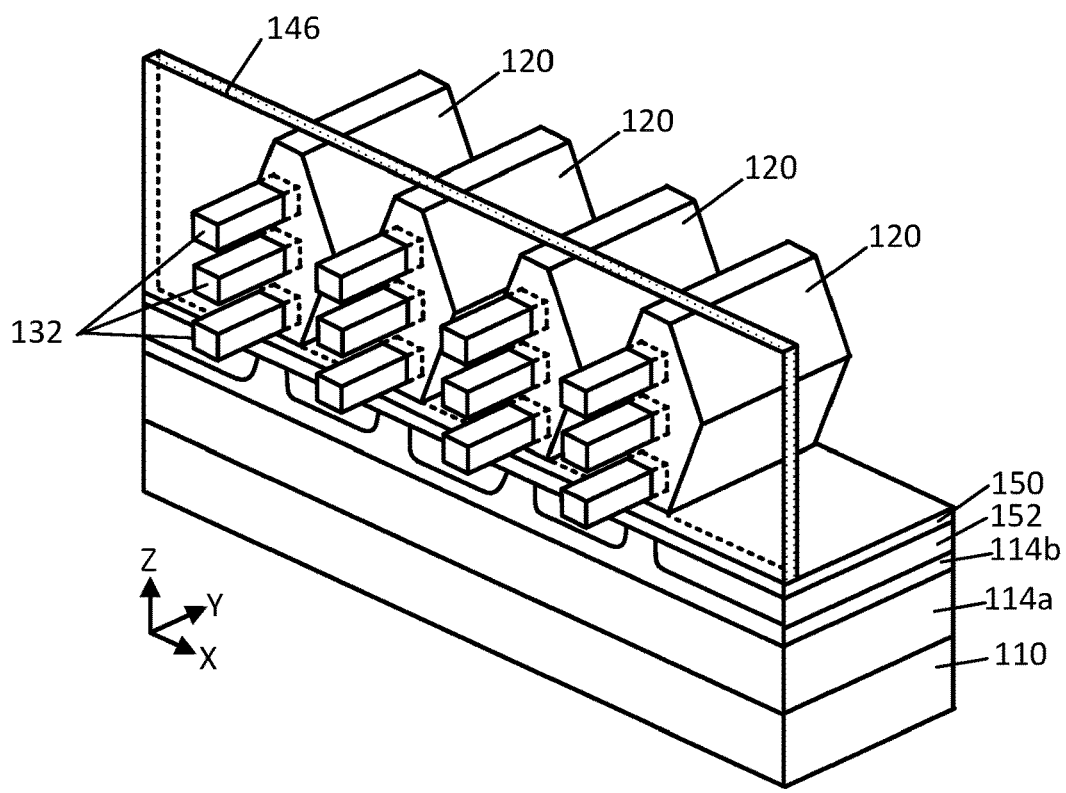
FIG. 10 illustrates a perspective view of a portion of the structure of FIG. 9 after removing the dummy gate electrode and releasing nanowires in the channel region, in accordance with an embodiment of the present disclosure.

In accordance with some embodiments, process 445 includes depositing 440 a layer of isolation material 150 after recessing 430 the fins 160. For example, a blanket layer of isolation material 150 is deposited conformally to result, for example, in the structure shown in FIG. 8. The isolation material 150 can be an oxide (e.g., $SiO_2$), nitride (e.g., $Si_3N_4$), a low-k dielectric (e.g., porous $SiO_2$ or material having a dielectric constant below 3.9), alumina, oxynitride compounds, carbonoxynitride compounds, a spin-on C-rich glass, or some other electrically insulating material. The isolation material 150 is useful to inhibit source-to-drain parasitic leakage via the relaxed buffer and/or substrate 110. FIG. 10 illustrates a perspective view of an example structure showing the layer of isolation material 150. An etch-resistant material can then be deposited conformally over the isolation material 150, followed by etching. Such processing leaves a layer of isolation material 150 on the subfin 162 portions of the fins 160, where the isolation material 150 blocks epitaxial growth from the subfin 162.

Figure 8:
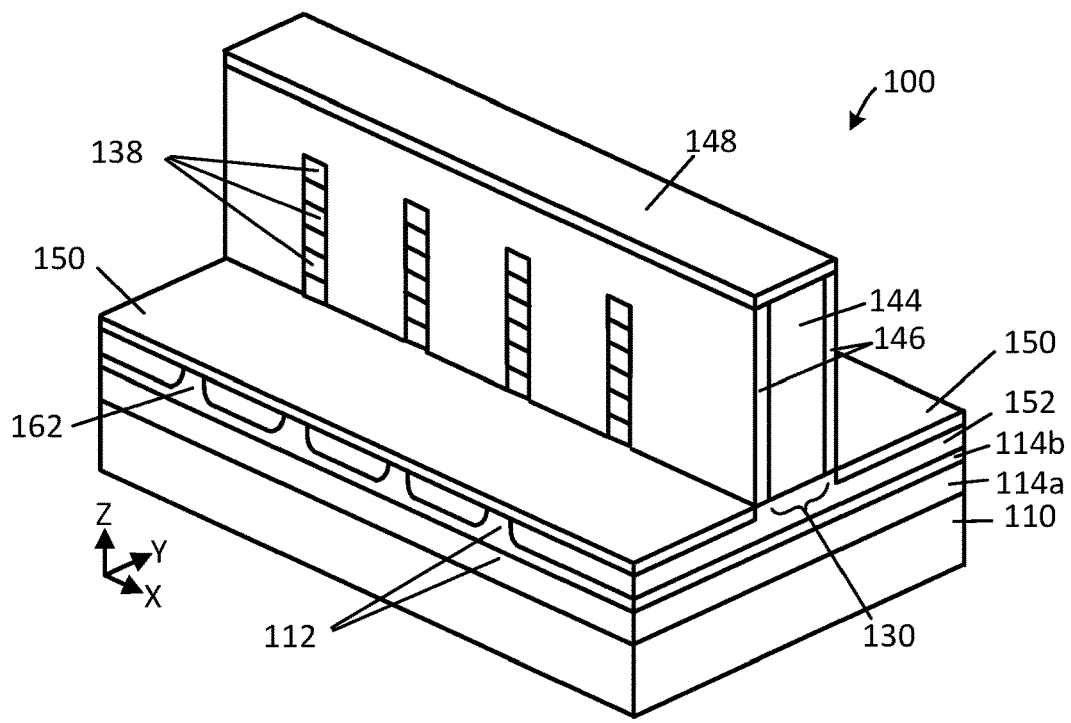
FIG. 8 illustrates a perspective view of the structure of FIG. 7 after recessing the fins adjacent the gate structure, in accordance with an embodiment of the present disclosure.

FIG. 8 illustrates a perspective view of an example structure after recessing the layer stack 134 in the source and drain regions 120 and depositing isolation material 150. The layer stack 134 in the S/D regions 120 and part of the buffer 112 has been recessed. In some embodiments, the S/D regions 120 can be further recessed, such as to the top surface of the substrate 110 or into the substrate 110. The channel material 138 in the channel region 130 is exposed at the face of the gate spacer 146.

Figure 9:
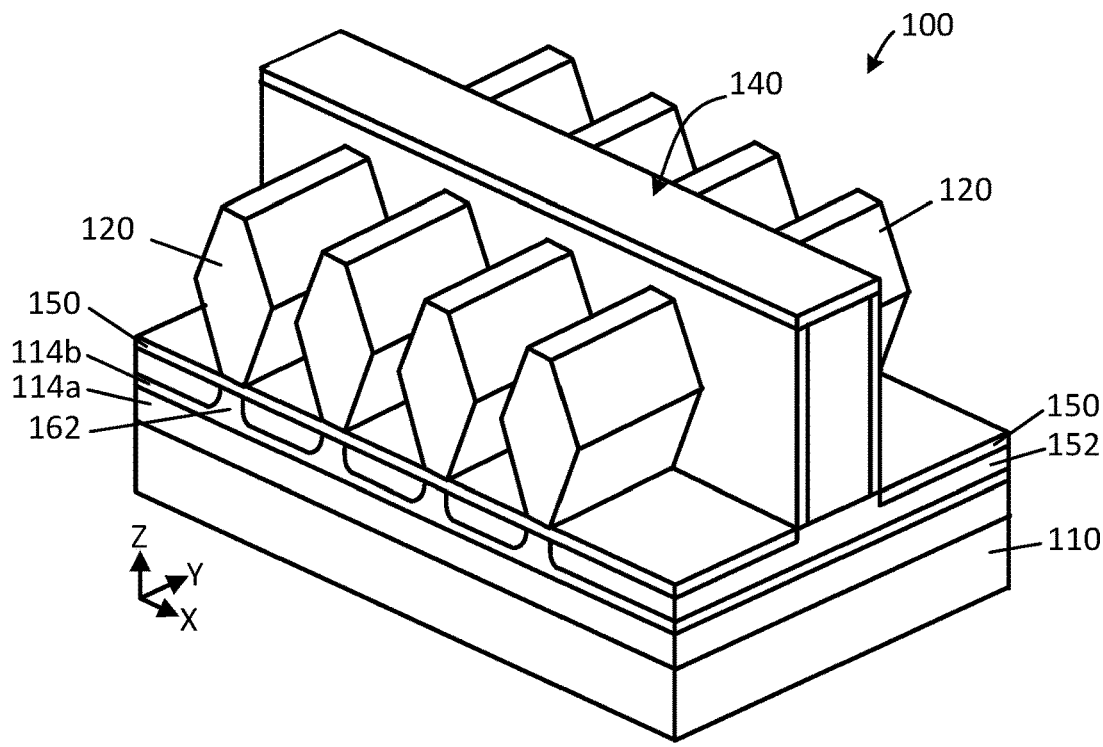
FIG. 9 illustrates a perspective view of the structure of FIG. 8 after epitaxial growth of replacement source and drains from the exposed channel material, in accordance with an embodiment of the present disclosure.

Process 445 continues with epitaxially growing 435 replacement S/D material using any suitable techniques, such as vapor-phase epitaxy (VPE), molecular beam epitaxy (MBE), or liquid-phase epitaxy (LPE), for example. Material of the source and drain regions 120 can be epitaxially grown laterally from the channel material 138 exposed at the gate spacer 146. For example, single-crystal material grows hemispherically outward from the exposed ends of the channel material 138. FIG. 9 illustrates a perspective view of an example structure after epitaxial growth of the replacement S/D 120 material. The layer of isolation material 150 is below each S/D 120 to reduce or prevent leakage via the buffer 114 and/or substrate 110.

In some embodiments, the source and drain 120 may be formed one polarity at a time, such as processing one of n-type and p-type S/D, and then processing the other of the n-type and p-type S/D. In some embodiments, the source and drain 120 may include any suitable doping scheme, such as including suitable n-type and/or p-type dopant (e.g., in a concentration in the range of 1E16 to 1E22 atoms per cubic cm). However, in some embodiments, at least one source or drain 120 may be undoped/intrinsic or relatively minimally doped, such as including a dopant concentration of less than 1E16 atoms per cubic cm, for example.

In some embodiments, one or more of the S/D 120 may have a multilayer structure including two or more distinct layers, for example. In some such embodiments, one or more of the layers of the S/D 120 may include grading (e.g., increasing and/or decreasing) the content/concentration of one or more materials in some or all of the S/D. For instance, in some embodiments, it may be desired to gradually increase the concentration of a given dopant or element as a given S/D 120 is formed, such as to reduce dopant diffusion. For example, the S/D has a relatively lower doping concentration near the channel region 130 and a relatively higher doping concentration near the corresponding S/D contact for improved contact resistance. Optionally, a dummy electrode can be formed in the S/D regions 120. Such dummy electrode can be subsequently removed for further processing of replacement S/D material as discussed below.

Method 400 continues with releasing 450 nanowires in the channel region. Process 450 may begin with removing the dummy gate electrode 144 between the gate spacers 146 to expose the channel region 130 of each fin 160. For example, a dummy gate electrode 144 of polycrystalline silicon can be removed using a wet etch process (e.g., nitric acid/hydrofluoric acid), an anisotropic dry etch, or other suitable etch process, as will be appreciated. At this stage of processing, the layer stack 134 of alternating layers of channel material 138 and sacrificial material 136 is exposed in the channel region 130. The channel region 130 of the layer stack 134 extends between and contacts the source and drain 120, where ends of the layer stack 134 are protected by the gate spacers 146. The sacrificial material 136 can be removed by etch processing, in accordance with some embodiments. For example, an etch process that is selective to remove the sacrificial material (e.g., InGaAs) in the layer stack is used to release 450 nanowires 132 of the channel material (e.g., InP).

Etching the sacrificial material 136 may be performed using any suitable wet or dry etching process such that the etch process selectively removes the sacrificial material 136 and leaves intact the channel material 138. In one embodiment, the sacrificial material 136 is InGaAs and the channel material 138 is InP. For these materials, a wet etch using citric acid and hydrogen peroxide has shown to selectively etch InGaAS in InGaAs/InP layer stacks. Other etch chemistries may be used based on the materials in the material stack 134 and the particular process conditions, as will be appreciated. After removing the sacrificial material 136, the resulting channel region 130 includes nanowires 132 extending between the epitaxial material of the source and drain 120, where ends of the nanowires 132 (e.g., InP) contact the source and drain 120 and remain at least partially protected by the gate spacers 146.

Optionally, the released nanowires 132 or nanoribbons can be cleaned and/or shaped using a series of oxide formation and etchback, as will be appreciated. For example, a thin surface oxide can be formed using thermal oxidation, deposition of an oxide plus annealing, or other suitable process. A wet or dry etch process can then be used to remove the oxide. Such a sequence of oxidation and oxide removal can remove residual amounts of the sacrificial material 136 and other impurities on the channel material 138.

FIG. 10 shows a part of an example structure of FIG. 10 after releasing nanowires 132 of the channel material 138. Ends of the nanowires 132 contact the S/D 120. The gate spacer 146 wraps around the end of each nanowire 132.

In embodiments where a dummy electrode was formed in the S/D regions in process 435, the dummy electrode is removed, followed by performing a dimple etch to remove the sacrificial material 136 under the gate spacer 146. In one embodiment, the dummy electrode is an amorphous material (e.g., polysilicon) that is removed using a suitable wet or dry etch process. The opening left by the dimple etch can be filled with a low-k dielectric material. In doing so, when depositing high-k dielectric during gate processing, the high-k dielectric is present only under the gate electrode 144, rather than extending into the cavity between ends of the nanowires protected by the gate spacer 146.

Method 400 continues with final gate processing 460. Gate processing 460 includes deposition of a gate dielectric 142 on the released nanowires/nanoribbons 132, followed by deposition of a gate electrode 144 over the gate dielectric 142, in accordance with some embodiments. In this example embodiment, the gate stack is formed using a gate-last fabrication flow, which may be considered a replacement gate or replacement metal gate (RMG) process. In embodiments utilizing a nanowire channel structure, the gate stack substantially (or completely) surrounds each nanowire body portion, such as wrapping around at least 80, 85, 90, 95% or more of each nanowire body.

Figure 11:
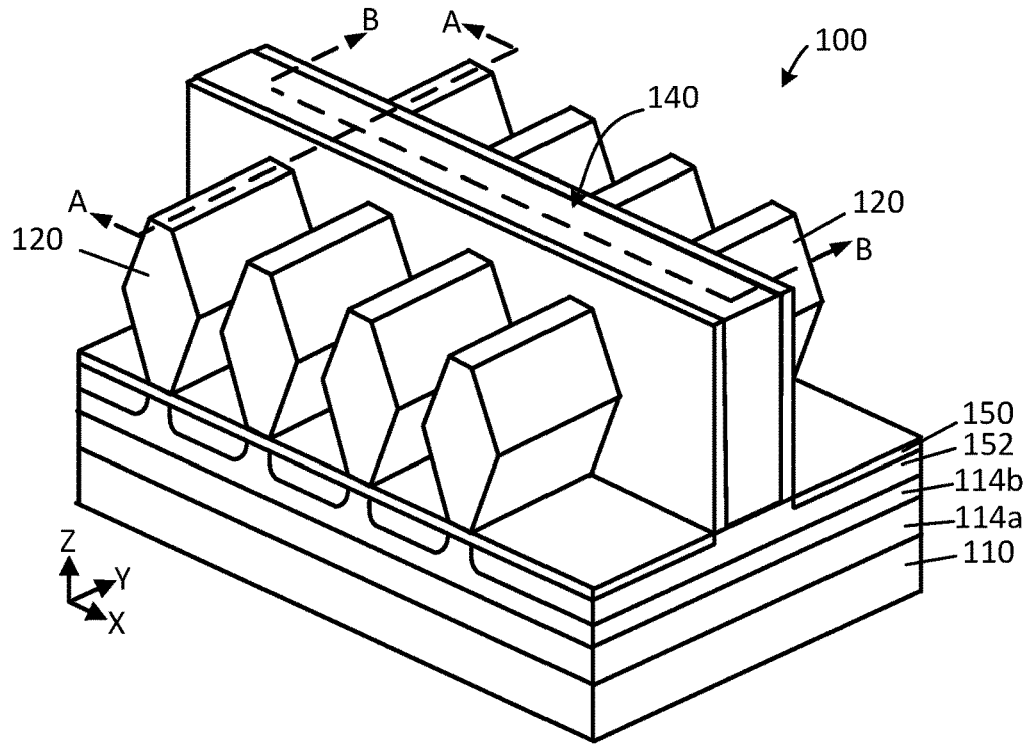
FIG. 11 illustrates a perspective view of a portion of the structure of FIG. 10 after replacement gate processing, in accordance with an embodiment of the present disclosure.

Gate processing 460 includes depositing a gate dielectric 142 on the exposed nanowire 132 bodies in the channel region 130, followed by formation of a gate electrode 144 in contact with the gate dielectric 142. FIG. 11 illustrates a perspective view of an example transistor structure 100 after gate processing 460, in accordance with some embodiments. Any suitable technique can be used, including spin-coating or CVD deposition, for example. The gate dielectric 142 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, the gate dielectric 142 can be annealed to improve its quality when high-k dielectric material is used. The gate electrode 142 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, the gate dielectric 142 and/or gate electrode 144 may include a multilayer structure of two or more material layers, for example. For instance, in some embodiments, a multilayer gate dielectric 142 may be employed to provide a more gradual electric transition from the channel region to the gate electrode. In some embodiments, the gate dielectric 142 and/or gate electrode 144 may include grading (e.g., increasing and/or decreasing) the content or concentration of one or more materials in at least a portion of the feature(s). In some embodiments, one or more additional layers may also be present in the final gate stack, such as one or more relatively high or low work function layers and/or other suitable layers. Note that the gate dielectric 142 may also be used to form replacement gate spacers on one or both sides of the nanowire body, such that the gate dielectric 142 is between the gate electrode 144 and one or both gate spacers 146, for example. Numerous different gate stack configurations will be apparent in light of this disclosure.

Figure 12:
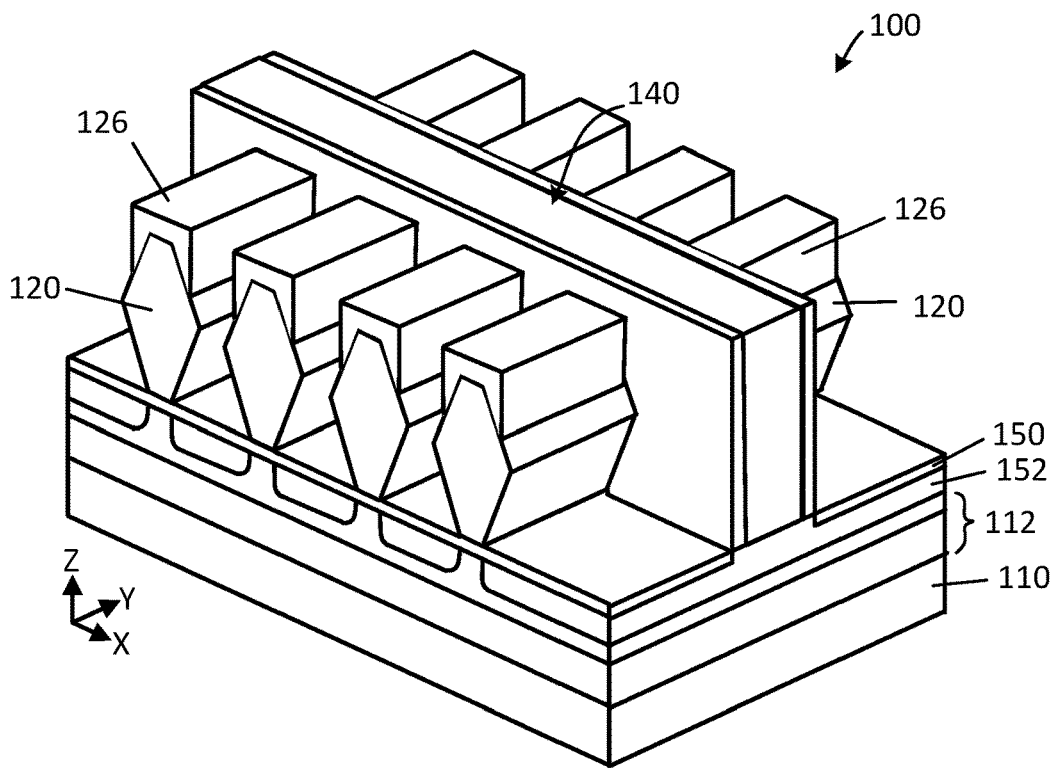
FIG. 12 illustrates a perspective view of a portion of the structure of FIG. 11 after processing the source and drain contacts, in accordance with an embodiment of the present disclosure.

Method 400 continues with forming 470 source/drain contacts 126. In some embodiments, process 470 includes first removing the dummy electrodes formed on the source/drain regions 120. The source and drain contacts 126 can be formed 470 using any suitable techniques, such as forming contact trenches in an ILD layer deposited over the respective source/drain regions, followed by depositing metal or metal alloy (or other suitable electrically conductive material) in the contact trenches. In some embodiments, forming 470 source/drain contacts 126 may include silicidation, germanidation, III-V-idation, and/or annealing processes, for example. In some embodiments, the source and drain contacts may include aluminum or tungsten, although any suitable conductive metal or alloy can be used, such as silver, nickel-platinum, or nickel-aluminum, for example. In some embodiments, one or more of the source and drain contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the source and drain contact regions, such as adhesion layers (e.g., titanium nitride) and/or liner or barrier layers (e.g., tantalum nitride), if so desired. In some embodiments, a contact resistance-reducing layer may be present between a given source or drain region and its corresponding source or drain contact 126, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding source or drain region 120, for example. FIG. 12 illustrates a perspective view of an example transistor structure 100 with S/D contacts 126 formed on the S/D 120, in accordance with some embodiments.

Method 400 continues with completing 480 a general integrated circuit (IC) as desired, in accordance with some embodiments. Such additional processing to complete an IC may include back-end or back-end-of-line (BEOL) processing to form one or more metallization layers and/or interconnect in contact with the transistor devices formed, for example. Any other suitable processing may be performed, as will be apparent in light of this disclosure. Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

Example System

Figure 13:
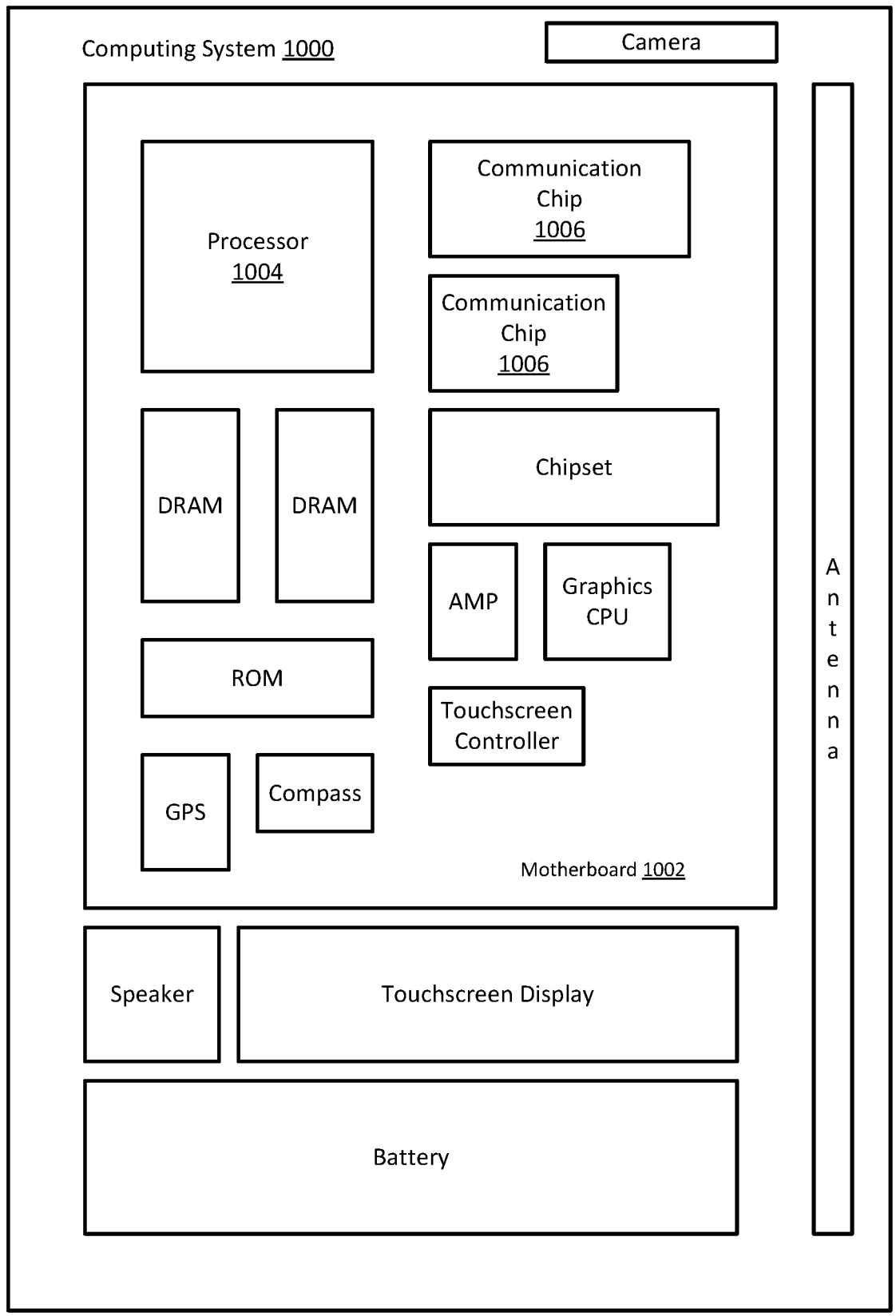
FIG. 13 illustrates an example computing system implemented with integrated circuit structures and/or transistor devices formed in accordance with some embodiments of the present disclosure.

FIG. 13 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit with at least one transistor, the integrated circuit comprising a substrate comprising silicon; a buffer structure on the substrate, the buffer structure including one or more layers of buffer material comprising indium, gallium, and phosphorous, wherein a ratio of indium to gallium in the one or more layers of buffer material increases from a first value of 0.35 or less to a second value of at least 2; a source and a drain on top of the buffer structure; a body of Group III-V semiconductor material extending between and connecting the source and the drain; and a gate structure in contact with the body, the gate structure including a gate electrode and a gate dielectric, wherein the gate dielectric is between the body and the gate electrode.

Example 2 includes the subject matter of Example 1, wherein the Group III-V semiconductor material comprises indium and phosphorous.

Example 3 includes the subject matter of Examples 1 or 2, wherein the at least one transistor includes a p-channel transistor.

Example 4 includes the subject matter of Example 1, wherein the Group III-V semiconductor material comprises indium, gallium, and arsenic.

Example 5 includes the subject matter of any of Examples 1-4, wherein the at least one transistor includes an n-channel transistor.

Example 6 includes the subject matter of any of Examples 1-5, wherein the body has fewer than 1E6 defects per $cm^2$.

Example 7 includes the subject matter of any of Examples 1-6, wherein the one or more layers of buffer material include a layer with a graded ratio of indium to gallium from the first value to the second value.

Example 8 includes the subject matter of Examples 1-7, wherein the first value is 0.25 or less.

Example 9 includes the subject matter of Example 8, wherein the first value is 0.

Example 10 includes the subject matter of any of Examples 1-9, wherein the second value is at least 3.

Example 11 includes the subject matter of any of Examples 1-10, wherein the buffer structure comprises a first layer having a ratio of indium to gallium from 0.25 to 0.33, a second layer having a ratio of indium to gallium from 0.95 to 1.1, and a third layer having a ratio of indium to gallium from 3 to 4.

Example 12 includes the subject matter of Example 1-11, wherein the buffer layer comprises a first layer with a mismatch no greater than 2.5% with respect to the substrate, a second layer with a lattice mismatch no greater than 2.5% with respect to the first layer, and a third layer with a lattice mismatch no greater than 2.5% with respect to the second layer.

Example 13 includes the subject matter of any of Examples 1-12 further comprising an additional layer of buffer material between the substrate and the one or more layers of buffer material, the additional layer of buffer material comprising gallium and phosphorous.

Example 14 includes the subject matter of any of Examples 1-13, wherein a difference in lattice constant between adjacent materials of the substrate, the one or more layers of the buffer material, and the body differs by no more than 0.13 Å.

Example 15 includes the subject matter of any of Examples 1-14, wherein the body is a fin comprising (i) indium and phosphorous or (ii) indium, gallium, and arsenic.

Example 16 includes the subject matter of Example 15, wherein the gate structure has a tri-gate configuration.

Example 17 includes the subject matter of any of Examples 1-16, wherein the at least one transistor is one of a plurality of transistors including one or more NMOS transistor and one or more PMOS transistor.

Example 18 includes the subject matter of any of Examples 1-14, wherein the body is a nanowire, nanoribbon, or nanosheet and the gate structure wraps around the body.

Example 19 includes the subject matter of Example 18, wherein the body is one of a plurality of spaced-apart bodies extending between the source and the drain.

Example 20 includes the subject matter of any of Examples 1-19, wherein the buffer structure is free of arsenic.

Example 21 includes the subject matter of any of Examples 1-20, wherein the buffer structure comprises a first layer of $In_{0.25}Ga_{0.75}P$, a second layer comprising $In_{0.50}Ga_{0.50}P$, and a third layer comprising $In_{0.75}Ga_{0.25}P$.

Example 22 includes the subject matter of Example 21 further comprising a layer of gallium phosphide between the substrate and the first layer.

Example 23 includes the subject matter of any of Examples 1-22, wherein the buffer structure has a vertical thickness less than 1 µm.

Example 24 includes the subject matter of any of Examples 1-23, wherein the substrate comprises bulk silicon.

Example 25 includes the subject matter of any of Examples 1-24, wherein the substrate is monocrystalline silicon.

Example 26 includes the subject matter of Example 1, wherein the at least one transistor is selected from a FinFET, a nanowire FET, and a nanoribbon FET.

Example 27 is a nanowire transistor structure comprising a substrate comprising silicon; a buffer structure on the substrate, the buffer structure including n layers of buffer material and comprising indium, gallium, and phosphorous, wherein a ratio of indium to gallium in a first layer of the n layers is 0.35 or less and the ratio in an nth layer of the n layers is at least 2; a source and a drain on top of the buffer structure; at least one body extending between and connecting the source and the drain, the body comprising a Group III-V semiconductor material; and a gate structure wrapped around each of the at least one body, the gate structure including a gate electrode and a gate dielectric, wherein the gate dielectric is between each of the at least one body and the gate electrode.

Example 28 includes the subject matter of Example 27, wherein the body comprises indium and phosphorous.

Example 29 includes the subject matter of Example 27, wherein the body comprises indium, gallium, and arsenic.

Example 30 includes the subject matter of any of Examples 27-29, wherein the at least one body has fewer than 1E6 defects per $cm^2$.

Example 31 includes the subject matter of any of Examples 27-30, wherein the n layers of buffer material include a layer with a graded concentration of indium, wherein the ratio increases from a first value of 0.35 or less to a second value of at least 2.

Example 32 includes the subject matter of any of Examples 27-31, wherein the n layers of buffer material include a first layer with the ratio of indium to gallium of 0, a second layer with the ratio of 1:3, a third layer with the ratio of 1:1, and a fourth layer with the ratio of 3:1.

Example 33 includes the subject matter of any of Examples 27-32, wherein each of the at least one body is selected from a nanowire, a nanoribbon, and a nanosheet.

Example 34 includes the subject matter of any of Examples 27-33, wherein the at least one body includes three or more bodies extending in a spaced-apart relationship between the source and the drain.

Example 35 includes the subject matter of any of Examples 27-34, wherein the n layers of buffer material have a relaxed lattice constant.

Example 36 includes the subject matter of any of Examples 27-34, wherein the nanowire transistor structure is an n-channel transistor.

Example 37 includes the subject matter of Example 27-34, wherein the nanowire transistor structure is a p-channel transistor.

Example 38 is a method of forming an integrated circuit with at least one transistor, the method comprising providing a substrate comprising monocrystalline silicon; forming a buffer structure on a substrate, the buffer structure having at least one layer of buffer material comprising indium, gallium, and phosphorous, wherein the buffer structure has an indium concentration that increases from a first amount to a second amount; forming a superlattice on the buffer structure, the superlattice having alternating layers of a first Group III-V material and a second Group III-V material; defining fins from the superlattice; removing the first Group III-V material in a channel region of the fins to define nanowires of the second Group III-V material; forming a gate structure wrapped around the nanowires, the gate structure including a gate electrode and a gate dielectric, wherein the gate dielectric is between each of the nanowires and the gate electrode; and forming a source and a drain adjacent the gate structure, the source and the drain connected by the nanowires.

Example 39 includes the subject matter of Example 38, wherein removing the first Group III-V material comprises depositing a dummy gate structure on the fins, the dummy gate structure including a dummy gate electrode between gate spacers; recessing the superlattice on opposite sides of the dummy gate structure; epitaxially growing replacement source and drain material adjacent the dummy gate structure; and removing the dummy gate electrode.

Example 40 includes the subject matter of Examples 38 or 39, wherein the first III-V material comprises indium, gallium, and arsenic and the second III-V material comprises indium and phosphorous.

Example 41 includes the subject matter of any of Examples 38-40, wherein a portion of the buffer structure has a lattice mismatch of no more than 2% with respect to the substrate.

Example 42 includes the subject matter of any of Examples 38-41, wherein the second Group III-V material comprises indium and phosphorous.

Example 43 includes the subject matter of any of Examples 38-42, wherein the substrate consists essentially of monocrystalline silicon.

Example 44 is an integrated circuit comprising the nanowire transistor structure of any of claims 27-37.

Example 45 includes the subject matter of Example 44, wherein the nanowire transistor structure is an NMOS transistor or a PMOS transistor.

Example 46 includes the subject matter of Example 44 or 45 further comprising a complementary metal-oxide-semiconductor (CMOS) circuit including at least one of a n-channel transistor and at least one p-channel transistor.

Example 47 is an integrated circuit die comprising the integrated circuit of any of claims 1-26.

Example 48 includes the subject matter of Example 47, wherein the at least one transistor comprises one or more of an NMOS transistor and one or more of a PMOS transistor.

Example 49 includes the subject matter of Example 47 or 48, wherein the at least one transistor comprises a metal-oxide-semiconductor (CMOS) circuit including at least one of a n-channel transistor and at least one p-channel transistor.

Example 50 is a computing system comprising the integrated circuit of any of claims 1-26 or the nanowire transistor structure of any of claims 27-37.

Example 51 includes the subject matter of Example 50, wherein the at least one transistor has a nanowire configuration, a nanoribbon configuration, or a nanosheet configuration.

Example 52 includes the subject matter of Example 50 or 51 further comprising a processor.

Example 53 includes the subject matter of any of Examples 50-52 further comprising a memory structure.

Example 54 includes the subject matter of any of Examples 50-53 further comprising a communication chip.

Example 55 includes the subject matter of any of Examples 50-54 further comprising a touch screen controller.

Example 56 includes the subject matter of any of Examples 50-55 further comprising dynamic random-access memory.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit with at least one transistor, the integrated circuit comprising:
   a substrate comprising silicon;
   a buffer structure on the substrate, the buffer structure including one or more layers of buffer material comprising indium, gallium, and phosphorous, wherein a ratio of indium to gallium in the one or more layers of buffer material increases from a first value of 0.35 or less to a second value of at least 2;
   a source and a drain on top of the buffer structure;
   a body of Group III-V semiconductor material extending between and connecting the source and the drain; and
   a gate structure in contact with the body, the gate structure including a gate electrode and a gate dielectric, wherein the gate dielectric is between the body and the gate electrode.

2. The integrated circuit of claim 1, wherein the Group III-V semiconductor material comprises indium and phosphorous.

3. The integrated circuit of claim 1, wherein the Group III-V semiconductor material comprises indium, gallium, and arsenic.

4. The integrated circuit of claim 1, wherein the body has fewer than 1E6 defects per $cm^2$.

5. The integrated circuit of claim 1, wherein the one or more layers of buffer material include a layer with a graded ratio of indium to gallium from the first value to the second value.

6. The integrated circuit of claim 1, wherein the first value is 0.25 or less.

7. The transistor structure of claim 6, wherein the second value is at least 3.

8. The integrated circuit of claim 1, wherein the buffer layer comprises a first layer with a mismatch no greater than 2.5% with respect to the substrate, a second layer with a lattice mismatch no greater than 2.5% with respect to the first layer, and a third layer with a lattice mismatch no greater than 2.5% with respect to the second layer.

9. The integrated circuit of claim 8 further comprising an additional layer of buffer material between the substrate and the one or more layers of buffer material, the additional layer of buffer material comprising gallium and phosphorous.

10. The integrated circuit of claim 1, wherein the body is a nanowire, nanoribbon, or nanosheet and the gate structure wraps around the body.

11. The integrated circuit of claim 10, wherein the body is one of a plurality of spaced-apart bodies extending between the source and the drain.

12. A nanowire transistor structure comprising:
    a substrate comprising silicon;
    a buffer structure on the substrate, the buffer structure including n layers of buffer material and comprising indium, gallium, and phosphorous, wherein a ratio of indium to gallium in a first layer of the n layers is 0.35 or less and the ratio in an nth layer of the n layers is at least 2;
    a source and a drain on top of the buffer structure;
    at least one body extending between and connecting the source and the drain, the body comprising a Group III-V semiconductor material; and
    a gate structure wrapped around each of the at least one body, the gate structure including a gate electrode and a gate dielectric, wherein the gate dielectric is between each of the at least one body and the gate electrode.

13. The nanowire transistor structure of claim 12, wherein the body comprises indium and phosphorous.

14. The nanowire transistor structure of claim 12, wherein the body comprises indium, gallium, and arsenic.

15. The nanowire transistor structure of claim 12, wherein the n layers of buffer material include a layer with a graded concentration of indium, wherein the ratio increases from a first value of 0.35 or less to a second value of at least 2.

16. The nanowire transistor structure of claim 12, wherein the n layers of buffer material include a first layer with the ratio of indium to gallium of 0, a second layer with the ratio of 1:3, a third layer with the ratio of 1:1, and a fourth layer with the ratio of 3:1.

17. The nanowire transistor structure of claim 12, wherein each of the at least one body is selected from a nanowire, a nanoribbon, and a nanosheet.

18. The nanowire transistor structure of claim 12, wherein the n layers of buffer material have a relaxed lattice constant.

19. The nanowire transistor structure of claim 12, wherein the nanowire transistor structure is an n-channel transistor.

20. The nanowire transistor structure of claim 12, wherein the nanowire transistor structure is a p-channel transistor.

* * * * *